United States Patent [19]

Zhao

[11] Patent Number: 5,736,457
[45] Date of Patent: Apr. 7, 1998

[54] METHOD OF MAKING A DAMASCENE METALLIZATION

[75] Inventor: Bin Zhao, Austin, Tex.

[73] Assignee: Sematech, Austin, Tex.

[21] Appl. No.: 811,954

[22] Filed: Mar. 5, 1997

Related U.S. Application Data

[63] Continuation of Ser. No. 352,578, Dec. 9, 1994, abandoned.

[51] Int. Cl.$^6$ ............................................. H01L 21/4763
[52] U.S. Cl. ..................... 438/624; 438/625; 438/626; 438/634; 438/638; 156/DIG. 652.1; 156/DIG. 653.1
[58] Field of Search ........................ 437/195, 190, 437/182, 203; 156/DIG. 652.1, DIG. 653.1; 438/622, 624, 625, 626, 634, 638

[56] References Cited

U.S. PATENT DOCUMENTS

| | | | |
|---|---|---|---|
| 3,844,831 | 10/1974 | Cass et al. | 437/195 |
| 3,865,624 | 2/1975 | Wilde | 437/195 |
| 3,961,414 | 6/1976 | Humphreys | 437/195 |
| 4,184,909 | 1/1980 | Chang et al. | 437/190 |
| 4,536,951 | 8/1985 | Rhodes et al. | 437/195 |
| 4,789,648 | 12/1988 | Chow et al. | |
| 4,832,789 | 5/1989 | Cochran et al. | |
| 5,100,816 | 3/1992 | Rodder | 437/190 |
| 5,141,897 | 8/1992 | Manocha et al. | 437/190 |
| 5,284,801 | 2/1994 | Page et al. | 437/190 |
| 5,286,674 | 2/1994 | Roth et al. | 437/190 |
| 5,354,711 | 10/1994 | Heitzmann et al. | 437/182 |
| 5,380,680 | 1/1995 | Choi | 437/190 |
| 5,399,527 | 3/1995 | Tabara | 437/190 |
| 5,451,543 | 9/1995 | Woo et al. | 437/190 |
| 5,462,893 | 10/1995 | Matsuoka et al. | 437/190 |
| 5,466,639 | 11/1995 | Ireland | 437/195 |
| 5,470,788 | 11/1995 | Biery et al. | 437/190 |
| 5,518,963 | 5/1996 | Park | 437/190 |
| 5,534,462 | 7/1996 | Fiordalice et al. | 437/190 |
| 5,543,360 | 8/1996 | Matsuoka et al. | 434/190 |

OTHER PUBLICATIONS

Dalal et al., "A Dual Damascene Hard Metal Capped CU and Al–Alloy for Interconnect Wiring of Ulsi Circuits," *IEEE, IEDM* 93 273–276 (1993).

Givens et al., "A Low–Temperature Local Interconnect Process in a 0.25μm–Chanel CMOS Logic Technology with Shallow Trench Isolation," *VMIC Conference*, pp. 43–48 (Jun. 7–8, 1994).

Kaanta et al., "Dual Damascene: A UlSI Wiring Technology," *VMIC Conference*, pp. 144–152 (Jun. 11–12, 1991).

Kikuta et al., "Multilevel Planarized–Trench–Aluminum (PTA) Interconnection Using Reflow Sputtering and Chemical Mechanical Polishing," *IEEE, IEDM* 93 285–288 (1993).

Lakshminarayanan et al., "Dual Damascene Copper Metallization Process Using Chemical–Mechanical Polishing," *VMIC Conference*, pp. 49–55 (Jun. 7–8, 1994).

Kikuta et al., Aluminum–Germanium–Copper Multilevel Damascene Process Using Low Temperature Reflow Sputtering and Chemical Mechanical Polishing, IEEE IEDM 94–101, pp. 5.2.1–5.2.4.

*Primary Examiner*—Charles L. Bowers, Jr.
*Assistant Examiner*—Lynne A. Gurley
*Attorney, Agent, or Firm*—Arnold, White & Durkee

[57] ABSTRACT

A semiconductor process and structure is provided for use in single or dual damascene metallization processes. A thin metal layer which serves as an etch stop and masking layer is deposited upon a first dielectric layer. Then, a second dielectric layer is deposited upon the thin metallization masking layer. The thin metallization masking layer provides an etch stop to form the bottom of the in-laid conductor grooves. In a dual damascene process, the thin metallization masking layer leaves open the via regions. Thus, the conductor grooves above the metallization masking layer and the via regions may be etched in the first and second dielectrics in one step. In a single damascene process, the thin metallization etch masking layer may cover the via regions. The etch stop and masking layer can be formed from any conductive or non-conductive materials whose chemical, mechanical, thermal and electrical properties are compatible with the process and circuit performance.

20 Claims, 4 Drawing Sheets

METHOD OF MAKING A DAMASCENE METALLIZATION

This application is a continuation of application Ser. No. 08/352,578, filed Dec. 9, 1994 now abandoned.

BACKGROUND OF THE INVENTION

This invention relates to metallization processes for semiconductor processing and more particularly to processes using "damascene" (or in-laid) metallization.

Metallization for integrated circuits is usually formed by first depositing the metal layer (usually Al or Al alloys) followed by the patterning process (i.e. lithography and etching). This sequence has various short-comings, such as the severe topographies that are generated by the etched metal pattern and the creation of small gaps between the metal lines that are difficult to fill by the subsequent dielectric layer. Metal etching processes also have problems in dimension control, etching residues and corrosion. In addition, plasma etching of some metals, for example Cu, is difficult.

Another way to form the metallization pattern on integrated circuits is to first etch the conductor pattern to form an in-laid pattern (or grooves) into the dielectric layer, then deposit a metal layer to fill the etched grooves in the dielectric. Typically the metal layer not only fills the grooves but also covers the entire semiconductor wafer. Next, the excess metal over the surface of the wafer is removed (except the portion of the metal in the grooves) using either a CMP (chemical mechanical polishing) process or an etchback process. This process will form in-laid conductors in the dielectric layer thus avoiding the issues associated with metal etching and dielectric gap filling. This in-laid metallization process is also called "damascene process."

Vias are needed to connect different metallization layers. In damascene processes, typically the via holes are formed in the dielectric layer, then the via holes are filled with metal, and then the excess metal over the wafer surface is removed. Such a process is called "damascened vias." The via formation is then followed either by the standard metallization process or by a damascened conductor layer as described above. Forming the vias and conductors separately has been called a "single damascene" process. A simpler process is to form both the via and the metallization patterns in the dielectric layer, followed by a single metal filling and excess metal removal process. The formation of the vias and conductors together has been called a "dual damascene" process.

The "dual damascene" process, even though simpler in concept, is more difficult than the "single damascene" in some aspects because both the via and conductor patterns must be etched in the dielectric layer before metal deposition. Performing both etches creates process control difficulties. Thus, it is desirable to develop a dual damascene process in which the via pattern etching process and the metal pattern etching process can be carried out in a manner such that there are no interactions between the two etches.

One approach for implementing a dual damascene interconnect structure has been the use of a multilayered dielectric, such as a $SiO_2/SiN/SiO_2$ or $SiO_2/Al_2O_3/SiO_2$ triple layer dielectric structure. The SiN or $Al_2O_3$ layer in such an approach acts as an etch stop layer upon which the conductor pattern etch is stopped. An example of a multilayered dielectric structure for use in damascene metallization is disclosed in U.S. Pat. No. 4,789,648 to Chow et al. Such processes using a SiN or $Al_2O_3$ layer as an etch stop have several benefits. However, such processes also create several problems.

First, both SiN and $Al_2O_3$ are dielectric materials with a high dielectric constant. (SiN~7.4, $Al_2O_3$~8.5). Thus, utilizing a SiN or $Al_2O_3$ layer between the various metal layers will increase the interconnect capacitance. When using SiN, critical dimension control may be difficult because of the plasma etch properties of $SiO_2$ and SiN. Silicon nitride layers generally exhibit larger stress than oxide layers and thus may lead to stress related problems such as voiding and notching of metal lines. Also, the dielectric strength of $Al_2O_3$ is usually an order of magnitude less than that of $SiO_2$ and SiN. This might lead to structure integrity problems during device operation. In addition, the resistivity of $Al_2O_3$ is about 2 order of magnitude less than $SiO_2$ and SiN. All these factors may lead to large leakage current between the metal lines and cause metal line integrity problems since the metal lines are directly on the $Al_2O_3$ or SiN layers.

In general, the prior art processes require at least two types of dielectric and one type of metal. Choosing three materials or more with the desired electrical, chemical, thermal and mechanical properties that are compatible with each other adds complexity to the fabrication process.

Thus, it is desirable to have an alternative process for the fabrication of damascene structures that lessens the problems and difficulties discussed above.

SUMMARY OF THE INVENTION

The present invention may be utilized in a single or dual damascene process. In either process, an etch stop layer is deposited above an inter-layer dielectric (ILD) layer. Then, an intra-metal dielectric (IMD) layer is deposited. The in-laid grooves for the damascened conductor are etched into the IMD layer. The bottom of the damascene grooves are formed by the etch stop layer upon which the etch of the IMD layer stops.

In a dual damascene process, the etch stop layer is patterned to be similar to the damascene conductor layer pattern, however, the etch stop layer pattern allows the etch stop layer to be removed from the regions which will subsequently become via regions. In a single damascene process, the etch stop layer pattern may include etch protection over the via regions since the etch stop layer can be conductive as illustrated in this invention.

After the etch stop layer is patterned and the IMD layer is deposited above the patterned etch stop layer, a reverse image of the damascene conductor pattern is photolithographically created upon the IMD layer. The grooves for the in-laid conductor are then etched. In the dual damascene process, this etch etches through the IMD layer and stops upon the etch stop layer. However, the etch continues through the ILD layer in the via regions which are not protected by the etch stop layer. In a single damascene process, the etch for the in-laid grooves stops upon the etch stop layer in all regions including the via regions because the etch stop layer covers the via regions. For both processes, standard damascene techniques may then be used to fill the in-laid grooves with a metallization and to remove this metallization above the grooves.

DETAILED DESCRIPTION

Figure 1A:
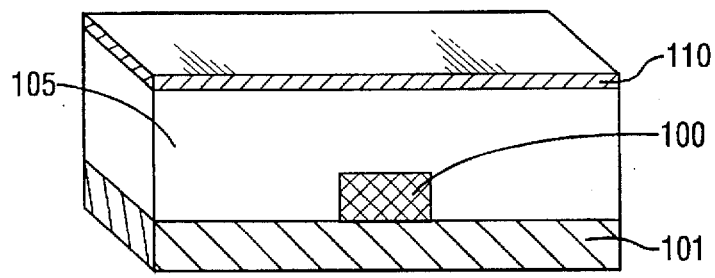
FIGS. 1(a), 1(b), 1(c), 1(d), 1(e), 1(f) and 1(g) illustrate a process flow for utilizing the present invention in a dual damascene process.

The processes and structures of the present invention may be seen with reference to FIGS. 1(a–g) and 2(a–g). FIGS. 1(a–g) illustrate a process flow for a dual damascene process and FIGS. 2(a–g) illustrate a process flow for a single damascene process. For illustrative purposes, the figures demonstrate the present invention as used for a damascened second level metal. In FIG. 1(a), a substrate 101 has a first level metal 100 that is covered by an inter-layer dielectric (ILD) layer 105. Though not shown in the figures, it will be recognized that the metal one layer 100 is formed upon a substrate (such as a semiconductor wafer) that may have various processing layers underneath the metal one layer. Typically, the dielectric 105 is utilized as part of the insulator between two metal layers, such as between a metal one layer and an in-laid metal two layer. However, the present invention may also be utilized between other interconnect layers or even between an in-laid metal one and the substrate and though described herein with reference to a metal two to metal one via cross-section, other metal layers and contact regions may similarly utilize the invention. Thus as used herein, the term via will be used generally to represent any contact location between metal two and metal one, metal one and substrate or polysilicon, or any other metal contact site.

After the ILD layer 105 is deposited, a thin etch stop layer 110 is deposited upon the ILD layer 105. As described below, etch stop layer 110 will be used as an etch stop for the damascene structure etch. Generally, the ILD layer 105 is an $SiO_2$ layer. However, the ILD layer may be formed from other dielectric materials such as, for example, SiOF, SiON, SiC, polyimides and polymers. Further, the etch stop layer 110 may generally be any conductive material having a low resistivity property. Typical materials used in semiconductor fabrication include Al-Cu, Ti, TiN, TiW, and though layer 110 is preferably a metal layer in one embodiment, if circuit performance criteria allow, layer 110 may also be formed by other conductors with higher resistance such as doped polysilicon or even be formed by insulators. As described below, the layer 110 will be used as an etch mask for the intra-metal dielectric (IMD) layer and thus the major process considerations in choosing the combination of the dielectric layers and the etch stop layer 110 include the selection of materials that have differing etching characteristics such that the etch of an IMD layer may stop upon the layer 110.

Figure 1B:
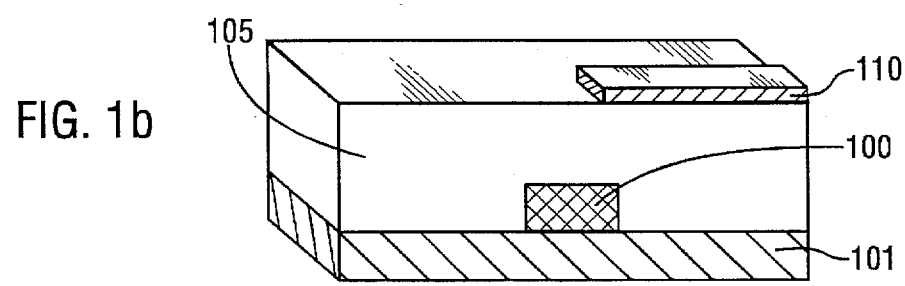
Figure 1C:
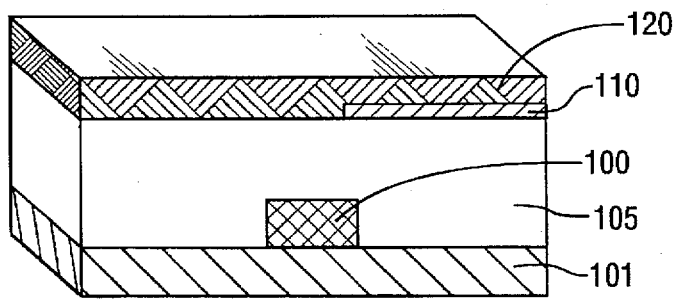
Figure 1D:
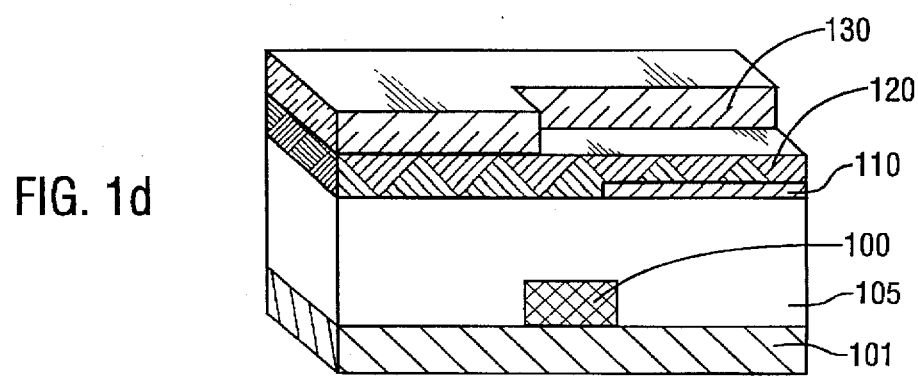

As shown in FIG. 1(b), the etch stop layer 110 has the pattern of the in-laid conductor transferred to it by photolithography and etch steps. As shown in FIG. 1(b), for a dual damascene process the pattern of the etch stop layer 110 does not include etch protection in the via areas. The IMD layer 120 is then deposited and planarized above the etch stop layer 110 as shown in FIG. 1(c). The IMD layer 120 may be formed from the same or a different type of dielectric material as the ILD layer 105. However, for process simplicity it may be desirable to utilize the same dielectric for both the IMD and ILD layers. As shown in FIG. 1(d), a reverse conductor pattern 130 is then patterned into the photoresist which is upon the IMD layer 120. The pattern of photoresist layer 130 is the reverse image of the in-laid conductor pattern. The opening width of the photoresist pattern 130 should be slightly less than the beneath corresponding pattern width of etch stop layer 110. This allows for critical dimension and layer to layer overlay errors.

Figure 1E:
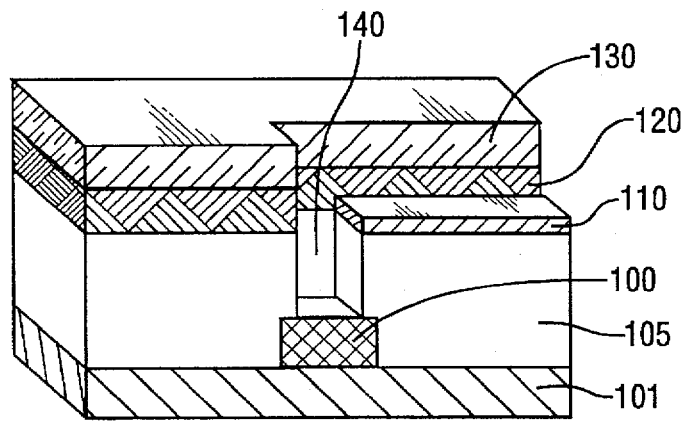
Figure 1F:
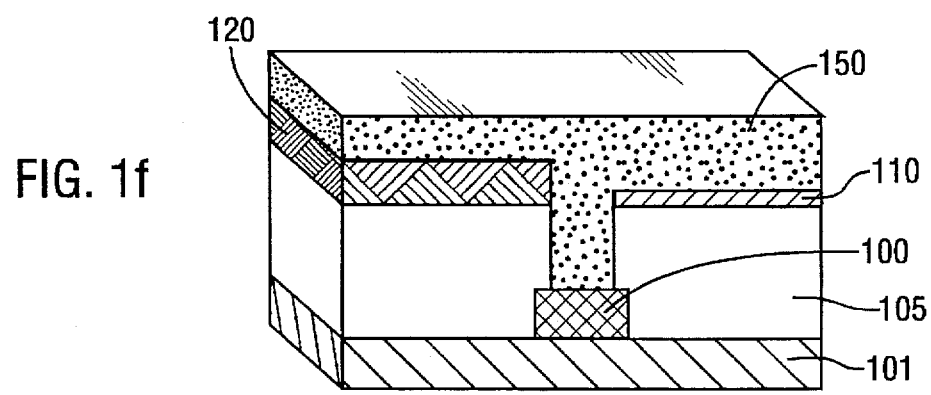
Figure 1G:
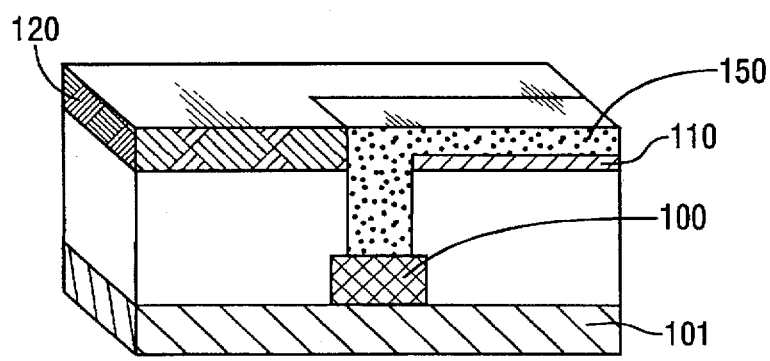

After the photoresist layer 130 has been patterned, a dielectric etch is performed as shown in FIG. 1(e). The dielectric etch stops at the layer 110 in the regions where the etch stop layer 110 is left on the substrate. Thus, etch stop layer 110 acts as a mask layer to stop the dielectric etch and define the bottom of the conductor pattern groove. The dielectric etch continues through the via region 140 where there is no etch stop layer protection until the etch reaches the first metal layer 100. Thus, the conductor pattern and the via hole pattern are etched in the ILD layer 105 and the IMD layer 120 in one step. The conductor grooves and via holes are then filled by a metal layer 150 as illustrated in FIG. 1(f). The metal layer 150 may be formed by various standard metal deposition techniques including using barrier, wetting or seeding layers. Further, standard metallization materials may be used for layer 150. The materials used for layer 150 and etch stop layer 110 may be the same or different. However, it may be desirable for process simplification to utilize the same material for etch stop layer 110 as is used for either metal layers 100 and 150 or one of their barrier, wetting and seeding layers, such as for example Ti or TiN. After the deposition of the metal layer 150, the excess metal above the surface of the IMD layer may be removed by standard damascene metal etch back or chemical mechanical polishing techniques. The resulting structure is shown in FIG. 1(g). This procedure can be repeated to continue building another or more interconnect metal structures.

Figure 2A:
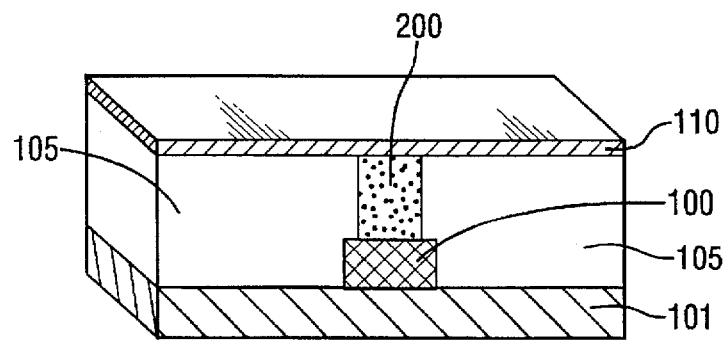
FIGS. 2(a), 2(b), 2(c), 2(d), 2(e), 2(f) and 2(g) illustrate a process flow according to the present invention for use in a single damascene process.
Figure 2B:
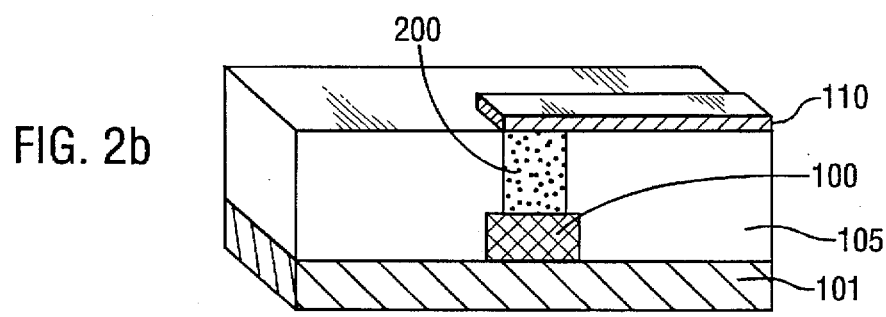

The process sequence shown in FIGS. 1(a)–(g) demonstrates the use of the present invention in a dual damascene process. However, the use of an etch stop layer for stopping and masking a portion of the dielectric etch may be similarly utilized in a single damascene structure. For the single damascene structure, the in-laid conductor pattern (including the via regions) may be transferred to the etch stop layer rather than the conductor pattern absent the via regions. The utilization of the present invention in a single damascene process is shown in FIGS. 2(a–g). In FIG. 2(a), a first metal layer 100 is shown having a via region 200 already etched and filled with a metallization. After region 200 is filled with a metallization, the etch stop layer 110 is deposited on the ILD layer 105. Next, the etch stop layer 110 is patterned and etched with the in-laid conductor pattern. As shown in FIG. 2(b), for the single damascene process the pattern of etch stop layer 110 may include protection over the via regions, however, alternatively the via regions may be unprotected as described for the dual damascene process. If a non-conductive etch stop layer is utilized, the etch stop layer must be removed above the vias to allow electrical contact between the metal one and metal two layers.

Figure 2C:
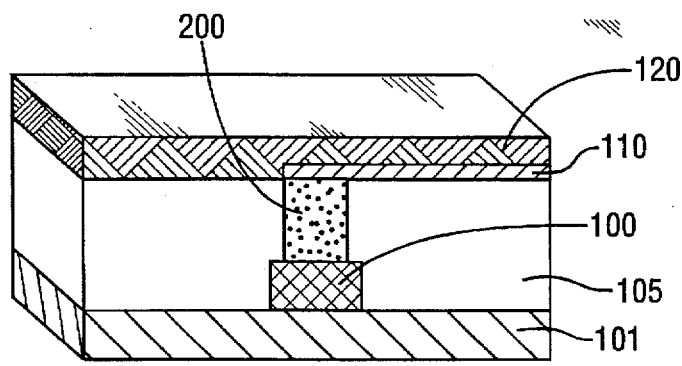
Figure 2D:
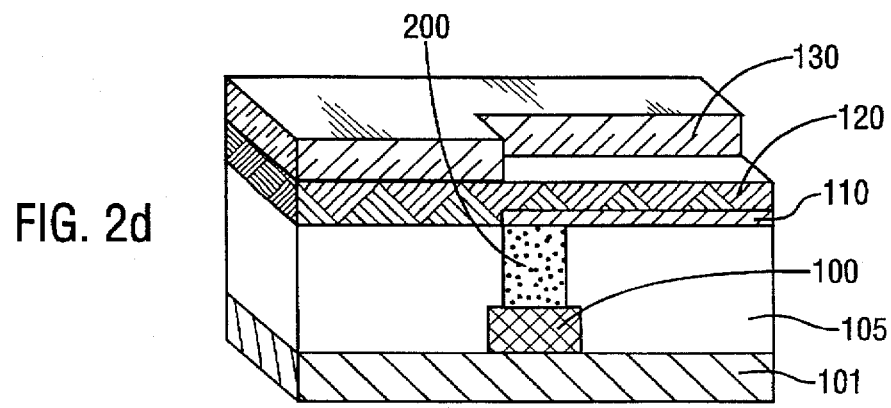

Next, the IMD layer 120 is deposited upon the wafer as shown in FIG. 2(c). The reverse image of the top conductor pattern is then patterned in a photoresist layer 130 on the IMD layer 120 as shown in FIG. 2(d).

Figure 2E:
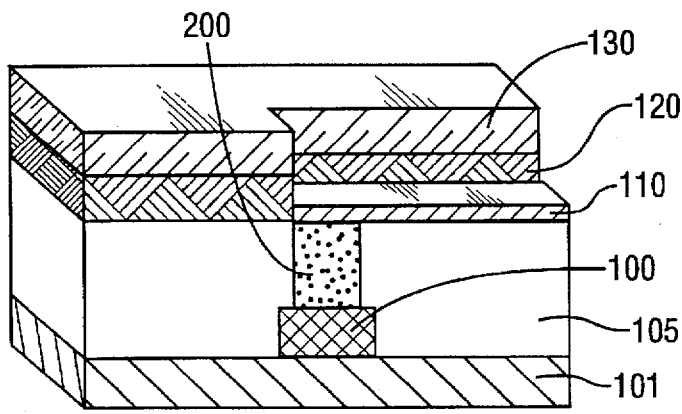
Figure 2F:
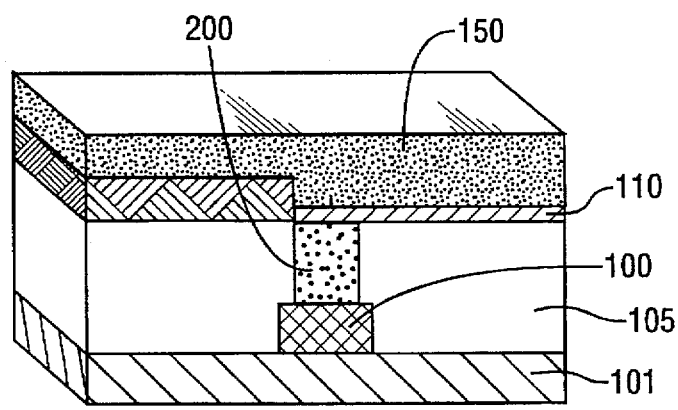
Figure 2G:
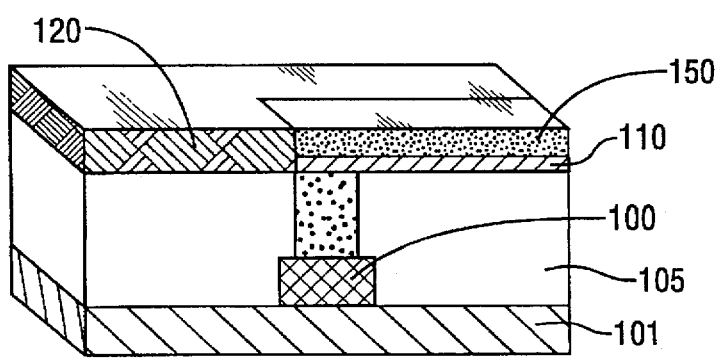

After photoresist 130 is patterned, a dielectric etch of layer 120 is performed as shown in FIG. 2(e). This dielectric etch stops on the etch stop layer 110. Then, as shown in FIGS. 2(f) and 2(g), metallization 150 is deposited across the entire wafer and then etched back or polished back to the top of the IMD layer 120.

The present invention is not limited to a specific type of metal and metal deposition process. For example, this invention can be applied to the Cu metallization processes. It is desirable that whatever metal deposition process is utilized, the vias and conductor regions are adequately filled with metal. Suitable processes may include a CVD metal, electroplating, hot metal deposition (i.e., metal depositions at approximately 400° or higher substrate temperatures), or processes in which the metal is subsequently flowed.

This invention offers the advantages which come from the fact that it is possible to have good process control (with the etch stop) and reduced process complexity (with only one type of dielectric material involved if the etch stop layer is selected to be conductive). If only one type of dielectric material is used to build the interconnect structure, the invention eliminates the circuit performance degradation coming from the interconnect capacitance increase in the prior art processes where another dielectric layer with a larger dielectric constant was used.

In both dual damascene and single damascene processes of this invention, the masking and etch stop layer 110 can be any conductive or non-conductive materials whose chemical, mechanical, thermal, and electrical properties are compatible with the process and circuit performance. When metal or metal alloy is used for the etch stop layer, due to the very different properties of metal and dielectric materials, it is easy to find an appropriate etch chemistry of large etch selectivity which leads to the advantages in process window, manufacturing cost and safety. Another advantage of using a conductor patterned layer as the etch stop layer, instead of a via-patterned insulator in the prior art processes, is that there is less area covered by the masking and etch stop layer. Also, for an etch stop layer with strong impermeability, such as SiN and $Al_2O_3$, the degassing from the underlying structures may create bubbles or other structure integrity problems during subsequent process steps (particularly for the process steps at elevated temperatures) if the etch stop layer is only opened at the vias regions. This may be particularly troublesome for polymer based dielectric layers.

Further modifications and alternative embodiments of this invention will be apparent to those skilled in the art in view of this description. For example, the metallization and dielectric materials shown herein are generally one type of materials which may be chosen, however, it will be recognized that the present invention may be utilized with other materials. Furthermore, some of the dielectric layers described herein may be replaced by one or more dielectric layers. Accordingly, this description is to be construed as illustrative only and is for the purpose of teaching those skilled in the art the manner of carrying out the invention. It will be understood that the forms of the invention herein shown and described are to be taken as illustrative embodiments. For example, equivalent elements or materials may be substituted for those illustrated as described herein, and certain features of the invention may be utilized independently of the use of other features, all these would be apparent to one skilled in the art after having the benefit of this description of the invention.

What is claimed is:

1. A method of forming an in-laid conductor in a conductor wiring pattern on a semiconductor substrate during a semiconductor fabrication process, comprising:

forming a first dielectric layer on said substrate;

forming an etch stop layer above said first dielectric layer;

removing a portion of said etch stop layer by etching said etch stop layer, at least a portion of a remaining region of said etch stop layer corresponding to said conductor wiring pattern;

forming a second dielectric layer, said second dielectric layer formed over said etch stop layer after said etch stop layer is etched;

etching said first dielectric layer to form a via region;

etching a conductor region corresponding to said conductor wiring pattern in said second dielectric layer, stopping at least a portion of said etching of said conductor region on said etch stop layer;

filling said via region with a conductive material; and filling said conductor region with said in-laid conductor.

2. The method of claim 1 wherein said etch stop layer comprises a conductive material.

3. The method of claim 2, wherein etching said first dielectric layer to form a via region and filling said via region with conductive material occur prior to forming said etch stop layer and etching said etch stop layer further comprises leaving said etch stop layer over said via region.

4. The method of claim 3 wherein said etch stop layer comprises the same material as said in-laid conductor or a barrier, wetting or seeding layer of said in-laid conductor.

5. The method of claim 1 wherein said etch stop layer comprises a dielectric material.

6. The method of claim 1, wherein etching said etch stop layer further comprises etching said etch stop layer from a via region and occurs prior to etching said first dielectric layer to form a via region.

7. The method of claim 6, wherein etching said conductor region is concurrent with etching said first dielectric layer to form said via region, and filling said conductor region is concurrent with filling said via region, and said conductive material is said in-laid conductor.

8. The method of claim 7, wherein said etch stop layer comprises a dielectric material.

9. A method for producing an in-laid metallization layer in an interlayer dielectric structure of a semiconductor device, comprising:

forming a first dielectric layer on said device;

forming an etch stop layer above said first dielectric layer, said etch stop layer being formed from a conductive material;

removing a portion of said etch stop layer by etching said etch stop layer, at least a portion of a remaining region of said etch stop layer corresponding to a conductor wiring pattern;

forming a second dielectric layer, said second dielectric layer formed over said etch stop layer after said etch stop layer is etched;

etching said first dielectric layer to form a via region;

etching a conductor region corresponding to said conductor wiring pattern in said second dielectric layer, stopping at least a portion of said etching of said conductor region on said etch stop layer;

filling said via region with a conductive material; and filling said conductor region with an in-laid conductor.

10. The method of claim 9 wherein said etch stop layer comprises the same material as said in-laid conductor, or a barrier, wetting or seeding layer of said in-laid conductor.

11. The method of claim 9, said etching said etch stop layer further comprising removing said etch stop layer from a via region.

12. The method of claim 11, wherein etching said conductor region occurs concurrent with removing said first dielectric layer from said via region, and filling said conductor region occurs concurrent with filling said via region, and said conductive material filling said via region is said in-laid conductor.

13. A method of forming an in-laid conductor within a dielectric layer on a semiconductor substrate during a semiconductor fabrication process, said in-laid conductor extending laterally in said dielectric layer in a conductor wiring pattern, the method comprising:

forming a first dielectric layer on said substrate;

forming an etch stop layer above said first dielectric layer;

etching said etch stop layer to remove a portion of said etch stop layer, at least a portion of a remaining region of said etch stop layer corresponding to said conductor wiring pattern;

forming a second dielectric layer, said second dielectric layer formed over said etch stop layer after said etch stop layer is etched;

etching laterally-extending trenches in said second dielectric layer, said trenches corresponding to said conductor wiring pattern, stopping at least a portion of said etching of said trenches on said etch stop layer; and filling said trenches with said in-laid conductor.

14. The method of claim 13, wherein said etch stop layer comprises a conductive material.

15. The method of claim 14, further comprising removing said first dielectric layer from a via region and filling said via region with a conductive material occur prior to forming said etch stop layer, and wherein etching said trenches further comprises leaving said etch stop layer over said via region.

16. The method of claim 14, wherein said etch stop layer comprises the same material as said in-laid conductor or a barrier, wetting or seeding layer of said in-laid conductor.

17. The method of claim 13, wherein said etch stop layer comprises a dielectric material.

18. The method of claim 17, further comprising etching said etch stop layer from a via region.

19. The method of claim 18, further comprising etching said first dielectric layer from a via region concurrent with etching said trenches, and filling said via region with said in-laid conductor concurrent with filling said trenches.

20. The method of claim 18, further comprising etching said first dielectric layer to form a via region and filling said via region with a conductive material occurs prior to forming said etch stop layer.

* * * * *